(12) United States Patent
Jow et al.

(10) Patent No.: US 8,035,036 B2
(45) Date of Patent: Oct. 11, 2011

(54) COMPLEMENTARY MIRROR IMAGE EMBEDDED PLANAR RESISTOR ARCHITECTURE

(75) Inventors: Uei-Ming Jow, Taichung (TW); Min-Lin Lee, Hsinchu (TW); Shinn-Juh Lay, Hsinchu (TW); Chin-Sun Shyu, Pingtung County (TW); Chang-Sheng Chen, Taipei (TW); Ying-Jiunn Lai, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 571 days.

(21) Appl. No.: 11/861,297

(22) Filed: Sep. 26, 2007

(65) Prior Publication Data

US 2008/0093113 A1 Apr. 24, 2008

(30) Foreign Application Priority Data

Oct. 20, 2006 (TW) .............................. 95138693 A

(51) Int. Cl.
*H05K 1/16* (2006.01)
(52) U.S. Cl. ........ 174/260; 174/250; 174/255; 174/394; 361/763; 361/765; 361/766; 361/767; 361/782
(58) Field of Classification Search .................. 174/260, 174/250, 255, 394; 361/763, 765–767, 782
See application file for complete search history.

(56) References Cited

U.S. PATENT DOCUMENTS

| | | | |
|---|---|---|---|
| 4,708,769 A * | 11/1987 | Burger et al. .................. 216/16 |
| 5,270,493 A * | 12/1993 | Inoue et al. ................... 174/253 |
| 5,811,820 A * | 9/1998 | Kirchner et al. ........... 250/432 R |
| 6,143,990 A * | 11/2000 | Kuramochi et al. .......... 174/260 |
| 6,525,623 B2 * | 2/2003 | Sridharan et al. ............. 333/128 |
| 6,765,298 B2 * | 7/2004 | Chin et al. ..................... 257/776 |
| 6,862,002 B2 | 3/2005 | Demicco et al. |
| 6,882,266 B2 | 4/2005 | Christian et al. |
| 6,963,265 B2 | 11/2005 | Cooper et al. |
| 7,371,970 B2 * | 5/2008 | Flammer et al. .............. 174/255 |
| 2005/0139385 A1 * | 6/2005 | Weston et al. ................ 174/260 |

(Continued)

FOREIGN PATENT DOCUMENTS

CN 1665370 9/2005

(Continued)

OTHER PUBLICATIONS

Article titled "Characterization of embedded resistors for high frequency wireless applications" authored by Na et al., Rawcon'98 Proceedings, 1998 IEEE (pp. 117-120).

(Continued)

*Primary Examiner* — Xiaoliang Chen
(74) *Attorney, Agent, or Firm* — Jianq Chyun IP Office

(57) ABSTRACT

A complementary mirror image embedded planar resistor architecture is provided. In the architecture, a complementary hollow structure is formed on a ground plane or an electrode plane to minimize the parasitic resistance, so as to efficiently enhance the application frequency. In addition, in some cases, some signal transmission lines pass through the position below the embedded planar resistor, and if there is no shield at all, serious interference or cross talk phenomenon occurs. Therefore, the complementary hollow structure of the ground plane, the electrode plane, or a power layer adjacent to the embedded planar resistor is designed to be a mesh structure, so as to reduce the interference or cross talk phenomenon. In this manner, the whole resistor structure has preferable high frequency electrical characteristic in the circuit.

12 Claims, 8 Drawing Sheets

U.S. PATENT DOCUMENTS

| | | | |
|---|---|---|---|
| 2006/0005383 A1* | 1/2006 | Fallon et al. | 29/830 |
| 2006/0121722 A1* | 6/2006 | Card et al. | 438/622 |
| 2006/0255342 A1* | 11/2006 | Kim et al. | 257/79 |
| 2007/0091161 A1* | 4/2007 | Shoji et al. | 347/200 |
| 2008/0290984 A1* | 11/2008 | Wei et al. | 338/309 |

FOREIGN PATENT DOCUMENTS

| | | |
|---|---|---|
| CN | 1741706 | 3/2006 |
| CN | 2785312 | 5/2006 |
| TW | 200612799 | 4/2006 |

OTHER PUBLICATIONS

Article titled "Embedded TiNxOy Thin-Film Resistors in a Build-Up CSP for 10 Gbps Optical Transmitter and Receiver Modules" authored by Shibuya et al., IEEE Transactions on Advanced Packaging, vol. 25, No. 3, Aug. 2002, (pp. 448-453).

Article titled "Quantitative Analysis of Resistance Variations in as-Deposited Nickel-Phosphorus (NiP) Embedded Resistors" authored by Cheng et al., 2003 Electronic Components and Technology Conference (pp. 156-160e.

Article titled "A Material System for High Precision Embedded Polymer Resistor" authored by Joseph T. Y. Su Ph. D, 9th int'l Symposium on Advanced Packaging Materials, (pp. 74-77).

Article titled "Embedded Resistors in Printed Wiring Boards" authored by Kimmo Perala, 9th int'l Symposium on Advanced Packaging Materials, (pp. 220-229).

Article titled "Design, Fabrication, and Reliability Assessment of Embedded Resistors and Capacitors on Multilayered Organic Substrates" authored by Lee et al., 2005 IEEE.

Article titled "Parameterized RF Models of Embedded Resistor Components Using EM Simulation in LTCC Substrates" authored by Johannsmann et al.

"1st Office Action of China counterpart application", issued on Jun. 12, 2009, p1-p8.

"Office Action of Taiwan counterpart application", issued on Dec. 29, 2009, p. 1-p. 7.

* cited by examiner

COMPLEMENTARY MIRROR IMAGE EMBEDDED PLANAR RESISTOR ARCHITECTURE

CROSS-REFERENCE TO RELATED APPLICATION

This application claims the priority benefit of Taiwan application serial no. 95138693, filed Oct. 20, 2006. All disclosure of the Taiwan application is incorporated herein by reference.

BACKGROUND OF THE INVENTION

1. Field of Invention

The present invention relates to a design of an embedded planar resistor in a multi-layer circuit substrate, and more particularly, to a complementary mirror image embedded planar resistor architecture, in which a complementary hollow structure is formed on a ground plane or an electrode plane adjacent to the embedded planar resistor.

2. Description of Related Art

High frequency, broadband, and miniaturization have almost become the greatest requirements for high-tech industries and markets, such as wireless communication, digital computers, portable electronic products, and information house appliances. Under the trend of using an embedded component to reduce the area of a circuit, generally, all circuit designers are anxious to form capacitors and resistors that are the most commonly used components in a circuit, which are passive components, by means of embedding instead of surface mounted technique (SMT). After the resistors are replaced by various structures or materials and are embedded through various processes, many parasitic components are formed between the embedded resistors and a metal ground plane or an electrode to generate parasitic effects, so as to present different electrical characteristics. Furthermore, the higher the frequency is, the deeper the influence of the parasitic effects is. When an applied digital/analog circuit is obviously designed to operate at a high frequency and in broadband application, the application of a component operating in the high frequency becomes more and more important.

Referring to FIG. 1A, it shows an architecture of an embedded planar resistor and a ground plane in a conventional art. In the architecture 100 with an embedded planar resistor and a ground plane, the embedded planar resistor 110 is located between two electrodes 120 and 122. As shown in FIG. 1A, the ground plane 130 is located below the embedded planar resistor 110, and a dielectric layer 140 is disposed therebetween. The design of the ground plane 130 is not considered in the architecture 100. However, a parasitic capacitor (such as a capacitor C in the figure) is greatly influenced by different dielectrics and characteristics thereof, such as thicknesses H1 and H2 of the embedded planar resistor 110, the thickness T1 of the electrodes 120 and 122, or the thickness H3 of the dielectric.

The embedded planar resistor 110 with the above-mentioned architecture is only applicable for a low frequency circuit. For example, an embedded planar resistor simulating architecture in FIG. 1B includes the embedded planar resistor 110, the two electrodes 120, 122, and the dielectric layer 140 disposed there-between. For example, if a high dielectric material having a dielectric constant of 17 (HiDK17) is employed and the embedded planar resistor of 400 ohm is designed, a frequency response simulating diagram for comparing the simulating architecture with the actually measured resistance is shown in FIG. 1C. In FIG. 1C, the numeral 151 indicates the frequency response curve of the simulating architecture, and the numeral 153 indicates the frequency response curve of the actually measured resistance. It can be seen from FIG. 1C that, when the frequency becomes higher, due to the ground plane below the embedded planar resistor, the impedance drops when the resistor is at a high frequency, which thus cannot meet the high frequency application requirements.

The prior art U.S. Pat. No. 5,270,493, entitled "Printed Circuit Board Having Electromagnetic Wave Shielding Layer And Self-contained Printed Resistor", disclosed an embedded planar resistor architecture. Referring to FIG. 2, the printed circuit board disclosed in this patent includes an embedded planar resistor 210 and an electromagnetic wave shield 220, so as to shield electromagnetic wave interference caused by transmission lines. However, the influence caused by the coupling of the embedded planar resistors cannot be avoided.

SUMMARY OF THE INVENTION

The present invention is directed to providing a complementary mirror image embedded planar resistor architecture. A hollow structure is formed in a ground plane or in an electrode, both of which are adjacent to the embedded planar resistor, so as to reduce the parasitic capacitance and efficiently enhance the application frequency range, and the dielectric loss between the embedded planar resistor and an adjacent metal layer is also reduced.

In an embodiment, the hollow structure is an entirely hollow structure similar to the structure of the embedded planar resistor.

In another embodiment, a mesh structure is formed in the ground plane or in the electrode corresponding to the position of the embedded planar resistor, so as to reduce the parasitic capacitance, efficiently shield the interference caused by a signal circuit in the lower layer, and efficiently enhance the application frequency range, and the dielectric loss between the embedded planar resistor and an adjacent conductive layer is also reduced.

In an application embodiment, the present invention provides a complementary mirror image embedded planar resistor architecture, which comprises an embedded planar resistor, a ground plane or an electrode layer or a power supply layer, and a dielectric layer. The embedded planar resistor is located on a first plane, and its two ends are respectively connected to a first conductive wire and a second conductive wire. The ground plane, the electrode layer, or the power supply layer is located on a second plane. The dielectric layer is sandwiched between the first plane and the second plane. A hollow structure is formed in the ground plane, the electrode layer, or the power supply layer at the mirror image location corresponding to the embedded planar resistor. The shape and size of the hollow structure for the embedded planar resistor can be adjusted according to design requirements.

In an application embodiment, the present invention provides a complementary mirror image embedded planar resistor architecture, which comprises an embedded planar resistor, a first electrode, a second electrode, a ground plane or an electrode layer or a power supply layer, and a dielectric layer. The embedded planar resistor is located on a first plane. The first electrode and the second electrode are disposed on the first plane. The first electrode is used to connect the embedded planar resistor to a first conductive wire, and the second electrode is used to connect the embedded planar resistor to a second conductive wire. The ground plane, the electrode layer, or the power supply layer is located on a second plane.

The dielectric layer is sandwiched between the first plane and the second plane. A hollow structure is formed in the ground plane, the electrode layer, or the power supply layer at the mirror image location corresponding to the embedded planar resistor. The shape and size of the hollow structure for the embedded planar resistor can be adjusted according to design requirements.

In an application embodiment, the present invention provides a complementary mirror image embedded planar resistor architecture, which comprises an embedded planar resistor, a first electrode, a second electrode, a ground plane or an electrode layer or a power supply layer, and a dielectric layer. The embedded planar resistor is located on a first plane. The first electrode and the second electrode are located on the first plane. The first electrode is used to connect the embedded planar resistor to a first via hole, so as to further connect the embedded planar resistor to circuit elements on other planes, The second electrode is used to connect the embedded planar resistor to a second via hole, so as to further connect the embedded planar resistor to circuit elements on other planes. The ground plane, the electrode layer, or the power supply layer is located on a second plane. The dielectric layer is sandwiched between the first plane and the second plane. A hollow structure is formed in the ground plane, the electrode layer, or the power supply layer at the mirror image location corresponding to the embedded planar resistor. The shape and size of the hollow structure can be adjusted according to design requirements.

In some cases, some signal transmission lines pass through the layer below the embedded planar resistor, and if there is no shield at all, serious interference or cross talk phenomenon may occur. Therefore, if the complementary hollow structure of the ground plane of the resistor is designed to be a mesh structure, the interference or cross talk phenomenon is reduced. In this manner, the whole resistor structure achieves the most preferred high frequency electrical characteristics in the circuit.

In an embodiment of the ground architecture of the complementary mirror image embedded planar resistor, the hollow structure is an entirely hollow structure, which is the same as or similar to the embedded planar resistor in shape, but substantially the same as or different from the embedded planar resistor in area.

In an embodiment of the complementary mirror image embedded planar resistor architecture, the hollow structure is a mesh structure with a plurality of holes.

In an embodiment of the complementary mirror image embedded planar resistor architecture, the hollow structure has a plurality of strip-shaped holes.

In an embodiment of the complementary mirror image embedded planar resistor architecture, there is more than one dielectric layer between the first plane and the second plane or the dielectric layer comprises other materials.

In an embodiment of the complementary mirror image embedded planar resistor architecture, the first electrode connected to the embedded planar resistor is grounded.

In an embodiment of the complementary mirror image embedded planar resistor architecture, the first electrode connected to the embedded planar resistor is a power supply, and the second electrode is grounded.

In an embodiment of the complementary mirror image embedded planar resistor architecture, the first conductive wire and/or the second conductive wire are micro-strip line structures.

In an embodiment of the complementary mirror image embedded planar resistor architecture, the first conductive wire and/or the second conductive wire are floating line structures.

In an embodiment of the complementary mirror image embedded planar resistor architecture, the first via hole and the second via hole are plating through holes (PTH) structures formed by a mechanical drilling machine.

In an embodiment of the complementary mirror image embedded planar resistor architecture, the first via hole and the second via hole are laser via structures formed by a laser ablation machine.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

DESCRIPTION OF EMBODIMENTS

The design of an embedded planar resistor usually presents different electrical characteristics due to the effects of the parasitic components generated between the embedded resistor and the conductive layer, such as a metal ground plane, an electrode layer, or a power supply layer. The higher the frequency is, the greater the influence of the parasitic effects is. On the other hands, when other signal transmission lines pass through, if there is no shield at all, serious interference or cross talk phenomenon occurs. In the present invention, the design of the structure between the embedded planar resistor and a ground plane or an electrode layer or a power supply layer is improved, so as to increase the application frequency, thus, the embedded planar resistor is more suitable for a high frequency application circuit.

In order to enhance the aforementioned characteristics, a novel structure must be designed to achieve the high frequency application. As for the design of a conventional embedded planar resistor, all electrodes are embedded in a circuit substrate and electrode contacts are usually connected to transmission lines or via holes. The common transmission line structures are, for example, a micro-strip line structures, so that the parasitic capacitance unavoidably occurs between the micro-strip line and a ground plane or an electrode layer below the micro-strip line.

The present invention provides a complementary mirror image embedded planar resistor architecture. A complementary hollow structure is formed in a ground plane or in an electrode layer adjacent to the embedded planar resistor, so as to reduce the parasitic capacitance and efficiently enhance the application frequency range, and the dielectric loss between the embedded planar resistor and a metal ground plane or an electrode layer or a power supply layer is also reduced.

In another alternative embodiment, the present invention provides a complementary mirror image embedded planar resistor architecture, in which a mesh structure is formed in a ground plane, an electrode layer, or a power supply layer adjacent to the embedded planar resistor. By such arrangement, the parasitic capacitance is reduced, the interference generated by a signal circuit in the lower layer is efficiently shielded, and the application frequency range is efficiently enhanced, and the dielectric loss between the embedded planar resistor and the metal ground plane, the electrode layer, or the power supply layer is reduced.

Figure 1A:
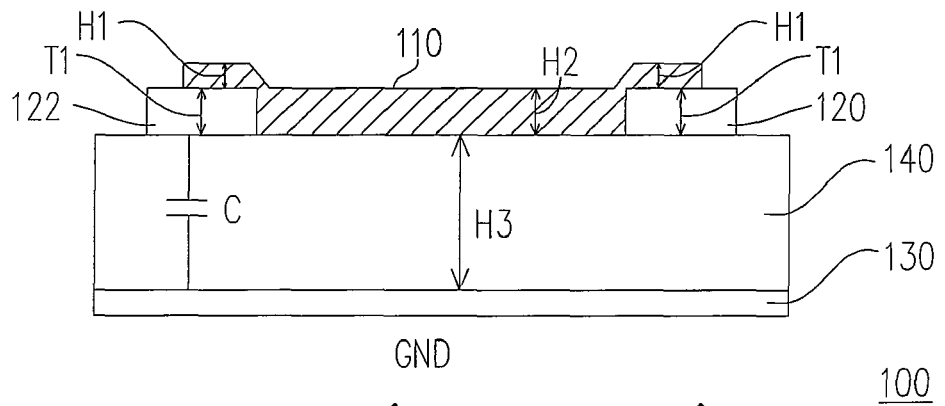
FIG. 1A shows an architecture of a conventional embedded planar resistor and a ground plane.
Figure 1B:
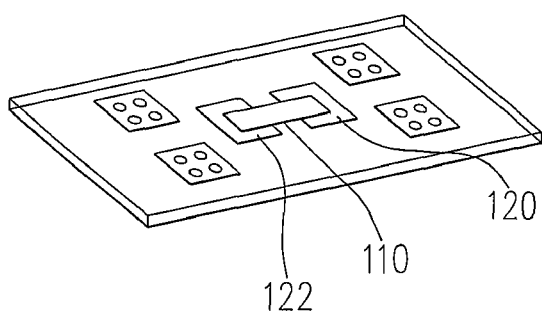
FIG. 1B shows a simulating architecture of the conventional embedded planar resistor.
Figure 1C:
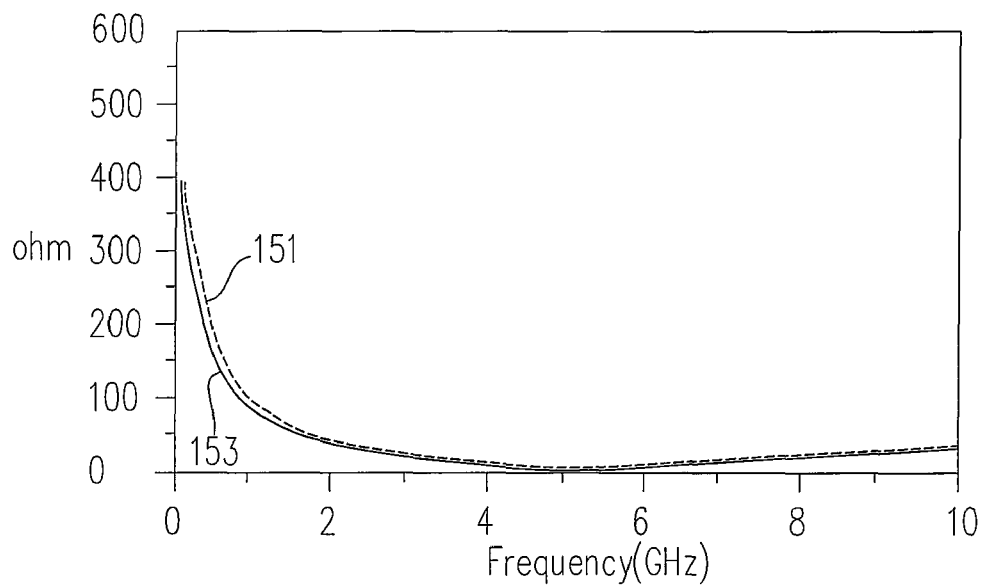
FIG. 1C is a frequency response simulating diagram for comparing the simulating architecture with the actually measured resistance according to the conventional embedded planar resistor and the ground plane.
Figure 2:
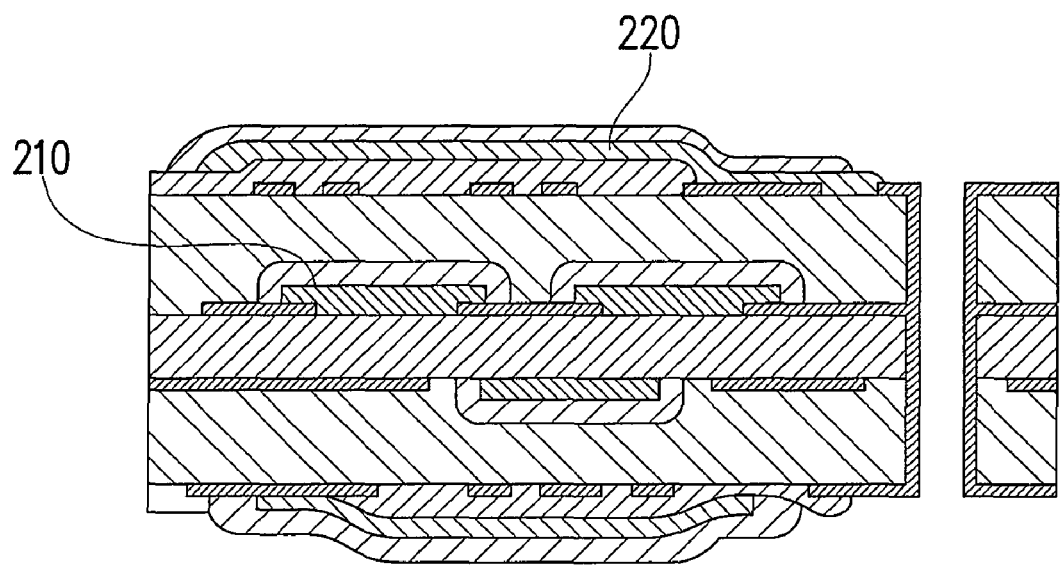
FIG. 2 shows conventional printed circuit board architecture with an embedded planar resistor.
Figure 3A:
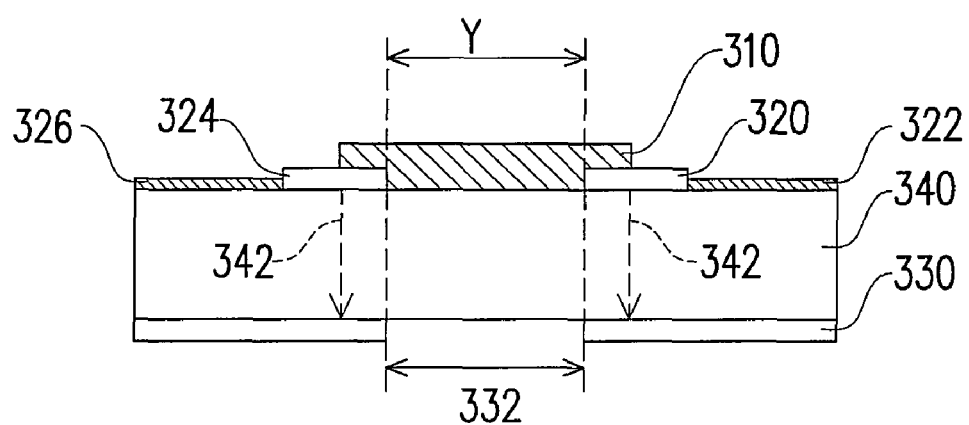
FIG. 3A is a schematic cross-sectional view of the ground architecture of the complementary mirror image embedded planar resistor according to a preferred embodiment of the present invention.
Figure 3B:
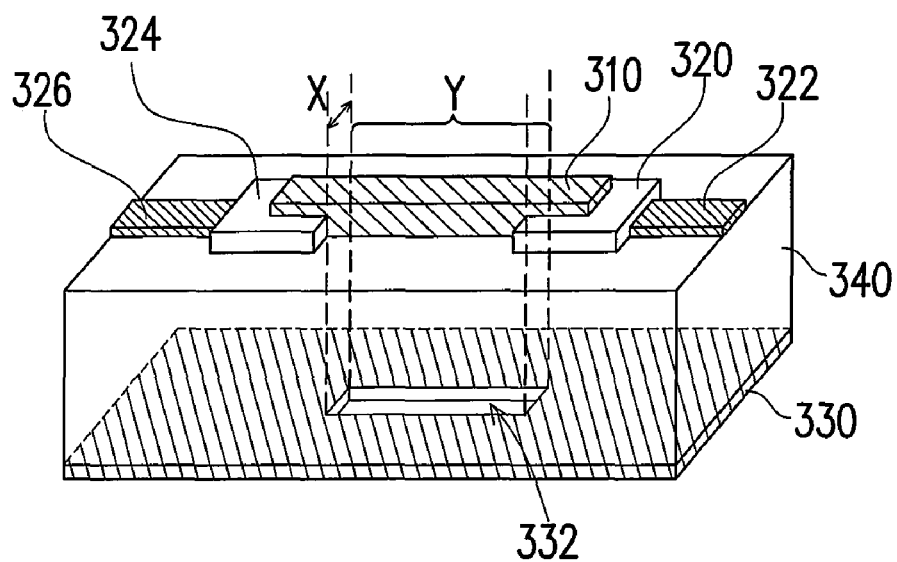
FIG. 3B is a perspective schematic side view of the ground architecture of the complementary mirror image embedded planar resistor according to a preferred embodiment of the present invention.

A embodiment of the present invention is illustrated below with reference to FIGS. 3A and 3B. FIG. 3A is a schematic cross-sectional view of a complementary mirror image embedded planar resistor architecture according to a preferred embodiment of the present invention, and FIG. 3B is a perspective schematic side view. The complementary mirror image embedded planar resistor architecture includes an embedded planar resistor 310 located between two electrodes 320 and 324, and an adjacent conductive layer, such as a ground plane, an electrode layer, or a power supply layer, and the ground plane is taken as an example herein. As shown in the figures, the ground plane 330 is located below the embedded planar resistor 310, and a dielectric layer 340 is located between the ground plane 330 and the embedded planar resistor 310. The electrodes 320 and 324 are respectively connected to transmission lines 322 and 326, which are, for example, micro-strip line structures.

As shown in the figures, the embedded planar resistor 310 has a portion with a length of X and a width of Y in the same layer between the electrodes 320 and 324, and a hollow structure 332 is correspondingly formed in the ground plane 330 by means of complementary mirror image. The size of the hollow structure 332 is substantially the same as that of the portion with a length of X and a width of Y in an embodiment, that is, the area of the hollow structure 332 is substantially equal to the area of the portion of the embedded planar resistor 310 in the same layer between the electrodes 320 and 324. However, in a practical application embodiment, the hollow structure 332 may be slightly larger than or smaller than the portion of the embedded planar resistor 310 in the same layer between the electrodes 320 and 324, which also falls within the scope of the present invention. In a preferred embodiment, the area of the hollow structure 332 is about 0.5-1.5 times of that of the portion of the embedded planar resistor 310. Additionally, the shape of the hollow structure 332 may be similar to or different from that of the portion of the embedded planar resistor 310. The complementary hollow structure formed in the ground plane 330 of the embedded planar resistor 310 reduces the parasitic capacitance 342, efficiently enhance the application frequency range, and reduce the dielectric loss between the embedded planar resistor and the metal ground plane.

In an alternative embodiment of the present invention, the size of the hollow structure 332 is also designed in consideration of the area of the two electrodes 320 and 324, i.e., the area of the hollow structure 332 may be designed to be substantially larger than, equal to, or smaller than the sum of the area of the portion of the embedded planar resistor 310 in the same layer between the two electrodes 320 and 324 and the areas of the two electrodes 320 and 324. In a practical application embodiment, the area of the hollow structure 332 is about 0.5-1.5 times of the sum of the area of the portion of the embedded planar resistor 310 and the areas of the electrodes 320 and 324.

Figure 3C:
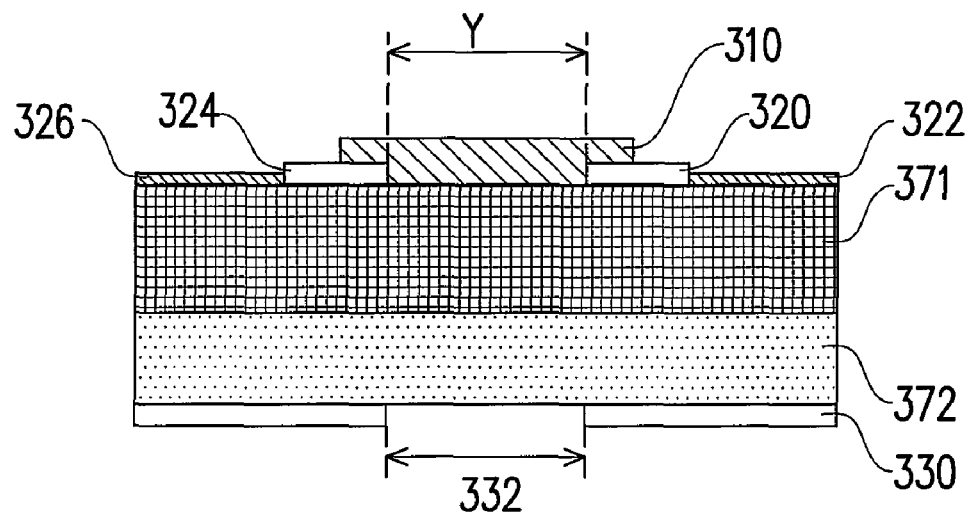
FIGS. 3C and 3D are a schematic cross-sectional view of the complementary mirror image embedded planar resistor according to other embodiments of the present invention.
Figure 3D:
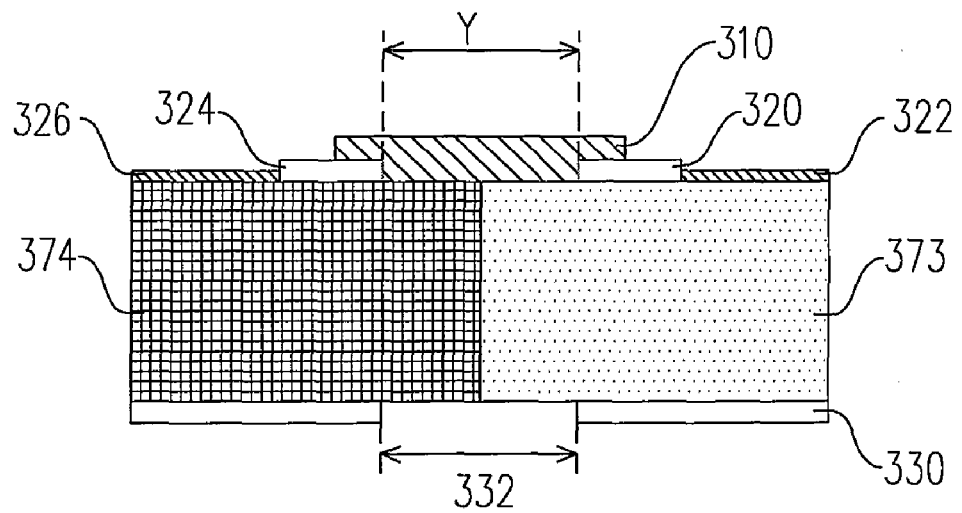

In alternative embodiments of the present invention, as shown in FIGS. 3C and 3D, the complementary mirror image embedded planar resistor architecture includes an embedded planar resistor 310 located between two electrodes 320 and 324, and an adjacent conductive layer, such as a ground plane, an electrode layer, or a power supply layer, and the ground plane 330 is taken as an example herein. A dielectric structure is located between the ground plane 330 and the embedded planar resistor 310. The dielectric structure includes a plurality of stacked dielectric layers, for example, as shown in FIG. 3C, a dielectric layer 371 and a dielectric layer 372. In another embodiment, the dielectric structure includes a plurality of dielectric layers located beside to each other, for example, as shown in FIG. 3D, a dielectric layer 373 and a dielectric layer 374 located in parallel between the ground plane 330 and the embedded planar resistor 310.

Figure 3E:
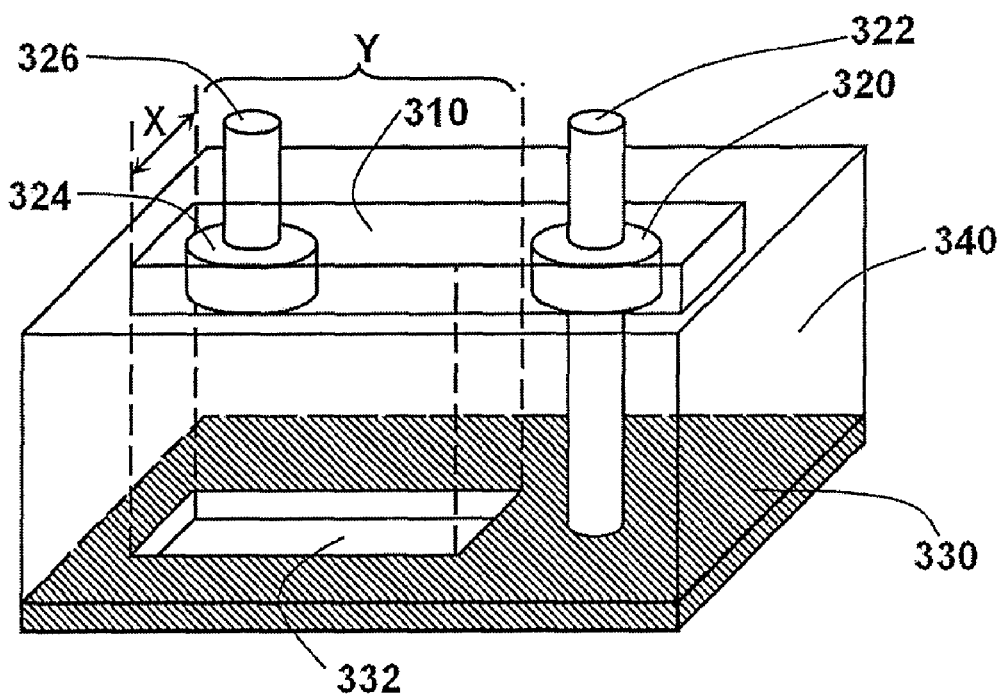
FIG. 3E is a perspective schematic side view of the ground architecture of the complementary mirror image embedded planar resistor according to a preferred embodiment of the present invention.

Another embodiment of the present invention is illustrated with reference to FIG. 3E. As shown in FIG. 3E, the complementary mirror image embedded planar resistor architecture includes an embedded planar resistor 310, a first electrode 320, a second electrode 324, a ground plane or an electrode layer or a power supply layer 330, and a dielectric layer 340. The embedded planar resistor is located on a first plane. The first electrode and the second electrode are located on the first plane, and the first electrode is used to connect the embedded planar resistor to a first via hole 322, so as to further connect the embedded planar resistor to circuit elements on other planes. The second electrode is used to connect the embedded planar resistor to a second via hole 326, so as to further connect the embedded planar resistor to circuit elements on other planes. The ground plane, the electrode layer, or the power supply layer is disposed on a second plane. The dielectric layer is sandwiched between the first plane and the second plane. A hollow structure is formed in the ground plane or the electrode layer or the power supply layer at the mirror image location corresponding to the embedded planar resistor. The shape and size of the hollow structure can be adjusted according to design requirements.

In an embodiment of the complementary mirror image embedded planar resistor architecture, the first via hole and the second via hole are plated through hole (PTH) structures formed by a mechanical drilling machine.

In an embodiment of the complementary mirror image embedded planar resistor architecture, the first via hole and the second via hole are laser via structures formed by a laser ablation machine.

In an embodiment of the complementary mirror image embedded planar resistor architecture, the first electrode connected to the embedded planar resistor is grounded through the first via hole 322.

In an embodiment of the complementary mirror image embedded planar resistor architecture, the first electrode connected to the embedded planar resistor is grounded through the first via hole 322, and the second electrode is connected to other layers through the second via hole 326.

Figure 4A:
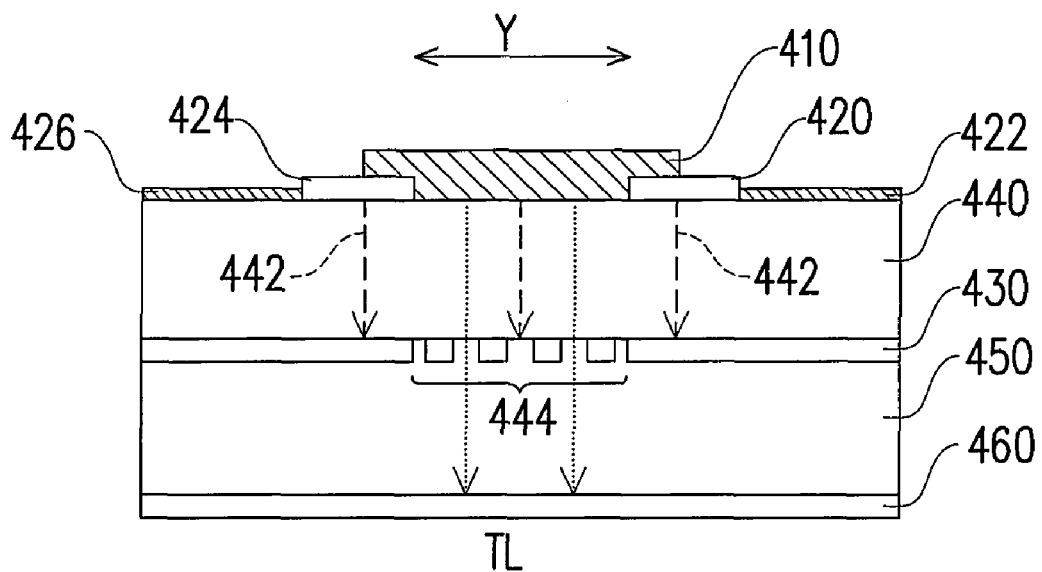
FIG. 4A is a schematic cross-sectional view of the ground architecture of the complementary mirror image embedded planar resistor according to a preferred embodiment of the present invention.
Figure 4B:
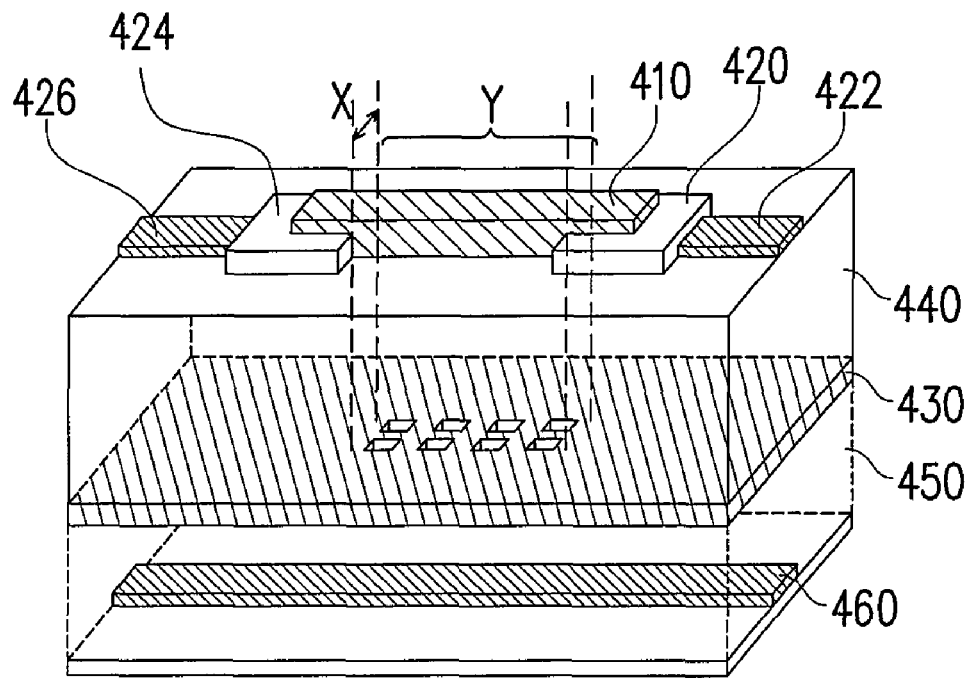
FIG. 4B is a perspective schematic side view.

Another embodiment of the present invention is illustrated with reference to FIGS. 4A and 4B. FIG. 4A is a schematic cross-sectional view of the ground architecture of the complementary mirror image embedded planar resistor according to a preferred embodiment of the present invention, and FIG. 4B is a perspective schematic side view. The ground architecture of the complementary mirror image embedded planar resistor includes: an embedded planar resistor 410 located between two electrodes 420 and 424, a ground plane 430 located below the embedded planar resistor 410, as shown in the figures, and a dielectric layer 440 sandwiched between the embedded planar resistor 410 and the ground plane 430. Another transmission line 460 is disposed below the ground plane 430. The electrodes 420 and 424 are respectively connected to the transmission lines 422 and 426, which are, for example, micro-strip line structures. As shown in FIG. 4A, not only the parasitic capacitance (as indicated by the numeral 442 in the figure) is generated between the embedded planar resistor 410 and the ground plane 430, to affect at high frequency application range, but the embedded planar resistor 410 is also further interfered and affected (as indicated by the numeral 444 shown in the figure) by the transmission line 460 on another layer.

As shown in the figure, the embedded planar resistor 410 has a portion with a length of X and a width of Y on the same layer between the two electrodes 420 and 424, and a mesh structure 432 is formed correspondingly in the ground plane 430 by means of complementary mirror image. The size of the mesh structure 432 is substantially equal to that of the portion with a length of X and a width of Y, and the mesh structure is formed by a plurality of regularly-arranged holes. In another alternative embodiment, the mesh structure 432 may be formed by a plurality of holes, which is arranged in a predetermined order or at random, and the shape and size are not limited as long as there is a plurality of holes, which may be a plurality of strip-shaped holes, for example.

The size of the whole mesh structure 432 may be larger than, equal to, or smaller than that of the portion of the embedded planar resistor 410 on the same layer between the two electrodes 420 and 424, which also falls within the application scope of the present invention. In a preferred embodiment, the area of the mesh structure 432 is about 0.5-1.5 times of that of the portion of the embedded planar resistor 410. The ground plane 430 of the embedded planar resistor 410 is formed into a hollow mesh structure, so as to reduce the parasitic capacitance, efficiently shield the interference generated by a signal circuit in the lower layer, and efficiently enhance the application frequency range, and the dielectric loss between the embedded planar resistor and the metal ground plane is also reduced.

In an alternative embodiment of the present invention, the size of the mesh structure 432 is also designed in consideration of the areas of the two electrodes 420 and 424, that is, the area of the whole mesh structure 432 may be designed to be larger than, equal to, or smaller than the sum of the area of the portion of the embedded planar resistor 410 on the same layer between the two electrodes 420 and 424 and the areas of the two electrodes 420 and 424. In an embodiment of practical application, the area of the mesh structure 432 is about 0.5-1.5 times of the sum of the area of the portion of the embedded planar resistor 410 and the areas of the two electrodes 420 and 424.

Figure 5A:
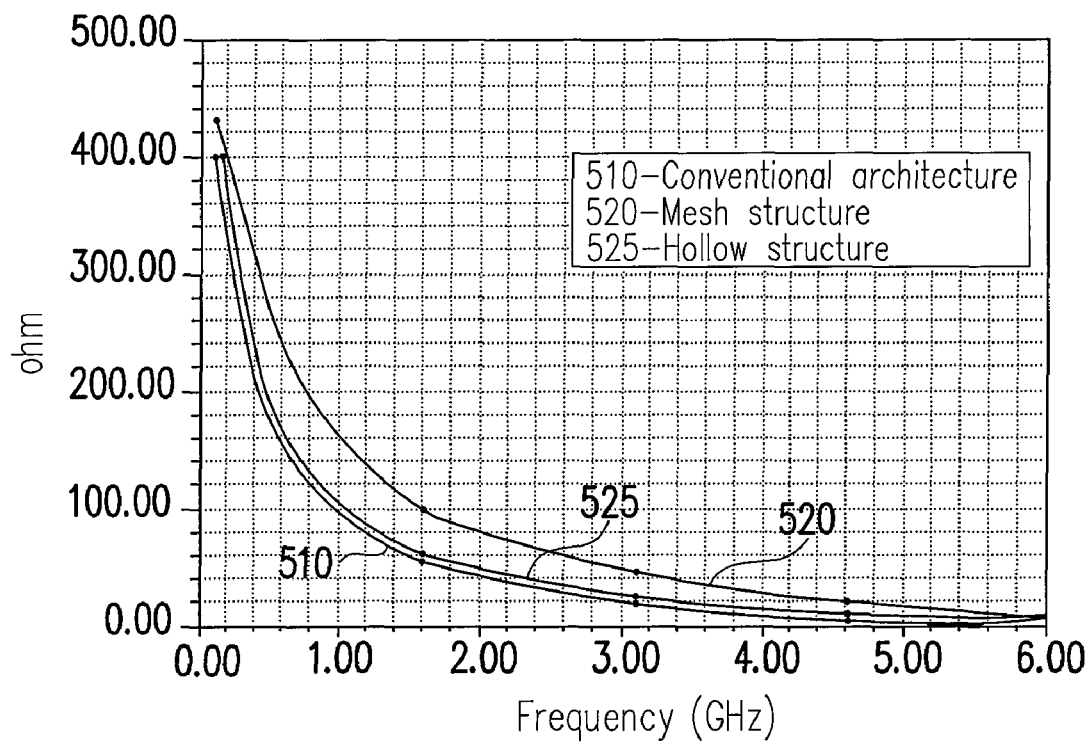
FIG. 5A is a resistance to frequency relation curve of the embedded planar resistor as for different ground planes.
Figure 5B:
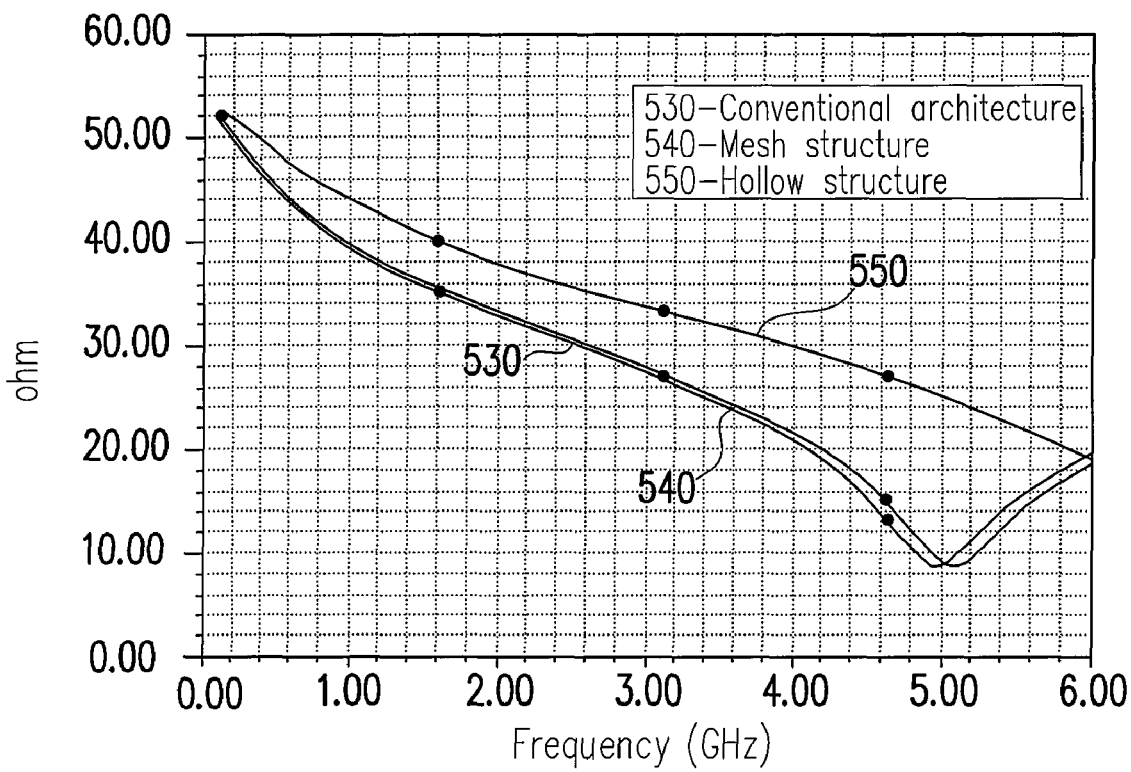
FIG. 5B is a impedance (db value) to frequency relation curve of the embedded planar resistor as for different ground planes.

Simulation analysis is performed according to the structures in the aforementioned embodiments. For example, the embedded planar resistor has an area of $30*30$ mil$^2$, a thickness of about 1.8 mil, and a resistance of 1 M ohm per square unit. The dielectric layer between the embedded planar resistor and the ground plane is made of the newly developed dielectric material HiDK17 having a high dielectric constant, and its thickness is about 8 mil. Referring to FIG. 5A, it is mainly a resistance to frequency relation curve of the embedded planar resistor as for different ground planes. In a conventional architecture, the reduction of the resistance as the frequency is increased is shown by the curve 510. As for the ground architecture of the complementary mirror image embedded planar resistor provided by the present invention, the ground plane of the embedded planar resistor is formed into a complementary hollow structure, and the resistance-frequency response is shown by the curve 520. Additionally, as for the ground architecture of the complementary mirror image embedded planar resistor provided by the present invention, the ground plane of the embedded planar resistor is formed into a mesh structure, and the resistance-frequency response is shown by the curve 525. The ground architecture of the complementary mirror image embedded planar resistor provided by the present invention does achieve an improved effect when being used for the high frequency application, wherein it is more preferred to form the ground plane of the embedded planar resistor into be a complementary hollow structure. Furthermore, FIG. 5B is mainly a impedance (db value) to frequency relation curve of the embedded planar resistor as for different ground planes.

As for the ground architecture of the complementary mirror image embedded planar resistor provided by the present invention, after the corresponding part of the ground plane below the embedded planar resistor is completely hollowed, if the resistance is designed to be 400 ohm, the self-resonant frequency is enhanced by about 2 GHz (from 5 GHz to 1 GHz), or the resistance is enhanced by about 20 ohm (from 400 ohm to 420 ohm). However, if the corresponding part of the ground plane below the embedded planar resistor employs the mesh design, and the resistance is designed to be 400 ohm, the self-resonant frequency is enhanced by about 200 MHz, or the resistance is enhanced, but not so obvious.

Figure 6:
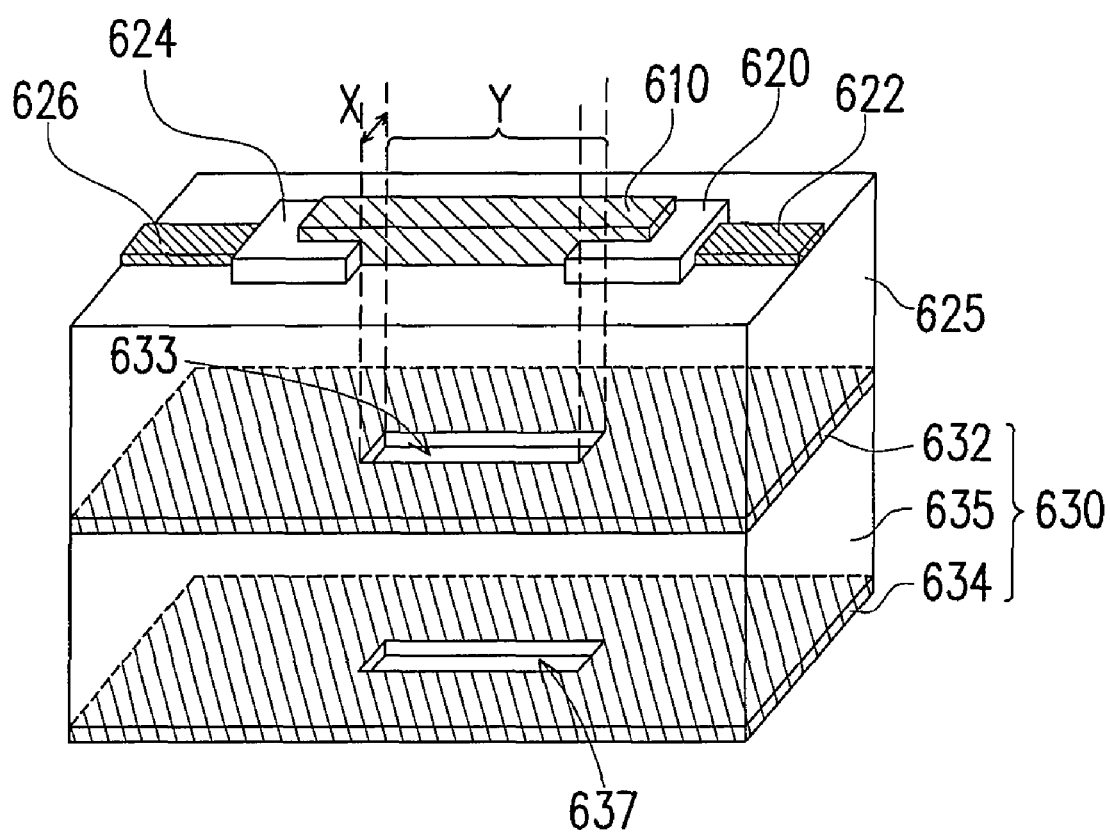
FIG. 6 is a schematic cross-sectional view of the complementary mirror image embedded planar resistor architecture according to a preferred embodiment of the present invention.

Still another specific embodiment of the present invention is illustrated with reference to FIG. 6. FIG. 6 is a schematic cross-sectional view of the complementary mirror image embedded planar resistor architecture according to one preferred embodiment of the present invention. The complementary mirror image embedded planar resistor architecture includes an embedded planar resistor 610 located between two electrodes 620 and 624, and an adjacent embedded capacitor structure 630. The embedded capacitor structure 630 includes, for example, an upper electrode plate 632, a lower electrode plate 634, and a dielectric layer 635 sandwiched there-between. As shown in FIG. 6, the upper electrode plate 632 is located below the embedded planar resistor 610, and another dielectric layer 625 is sandwiched between the upper electrode plate 632 and the embedded planar resistor 610. The electrodes 620 and 624 are respectively connected to transmission lines 622 and 626, which are, for example, micro-strip line structures.

As shown in FIG. 6, the embedded planar resistor 610 has a portion with a length of X and a width of Y on the same layer between the two electrodes 620 and 624, and a hollow structure 633 is formed correspondingly in the upper electrode plate 632 by means of complementary mirror image, wherein the size of the hollow structure 633 is substantially equal to that of the portion with a length of X and a width of Y in an embodiment, that is, the area of the hollow structure 633 is substantially equal to that of the portion of the embedded planar resistor 610 on the same layer between the two electrodes 620 and 624. However, in an embodiment of practical application, the hollow structure 633 may also be slightly larger than or smaller than the portion of the embedded planar resistor 610 on the same layer between the two electrodes 620 and 624, which also falls within the application scope of the present invention. Additionally, the shape of the hollow structure 633 is similar to or different from that of the portion of the embedded planar resistor 610. A complementary hollow structure is formed in the upper electrode plate 632 adjacent to the embedded planar resistor 610, so as to reduce the parasitic capacitance, efficiently enhance the application frequency range, and reduce the dielectric loss between the embedded planar resistor and the metal ground plane.

In an alternative embodiment of the present invention, the size of the hollow structure 633 also can be designed in consideration of the areas of the electrodes 620 and 624, that is, the area of the hollow structure 632 may be designed to be larger than, equal to, or smaller than the sum of the area of the portion of the embedded planar resistor 610 on the same layer between the two electrodes 620 and 624 and the areas of the electrodes 620 and 624.

In an alternative embodiment of the present invention, the upper electrode plate 632 and the lower electrode plate 634 of the embedded capacitor 630 are respectively formed into hollow structures 633 and 637 by means of complementary mirror image, so as to reduce the parasitic capacitance, and efficiently enhance the application frequency range.

Figure 7:
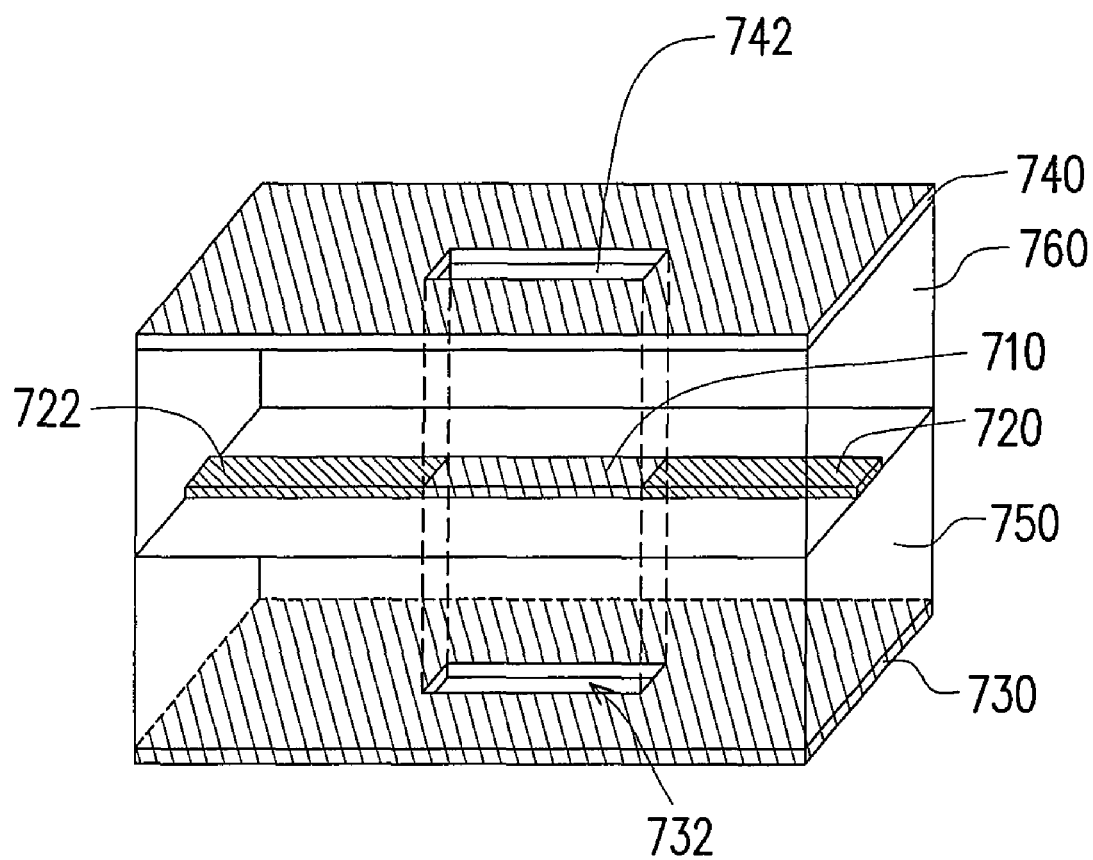
FIG. 7 is a schematic cross-sectional view of a complementary mirror image embedded planar resistor architecture according to another preferred embodiment of the present invention.

Another particular embodiment of the present invention is illustrated with reference to FIG. 7. FIG. 7 is a schematic cross-sectional view of a complementary mirror image embedded planar resistor architecture according to another preferred embodiment of the present invention. The complementary mirror image embedded planar resistor architecture includes an embedded planar resistor 710 that is located between two ground planes 730 and 740 and connected to strip lines 720 and 722, which are so-called strip line structures. A common strip line has contacts in the embedded metal, but in this embodiment, the contacts of the metal and the transmission lines are integrated as a whole. Therefore, no specific larger contacts are shown, and thus, no electrodes as that in FIG. 6 are shown. The strip line structure is often used in a design of a micro-wave circuit. Therefore, in this embodiment, the embedded planar resistor 710 requires that the upper ground plane 730 and the lower ground plane 740 both have a hollow structure. The complementary mirror image embedded planar resistor architecture includes, for example, the lower ground plane 730, the upper ground plane 740, and dielectric layers 750 and 760 sandwiched there-between. The lower ground plane 730 and the upper ground plane 740 have the hollow structures 732 and 742 respectively.

Additionally, the shapes of the hollow structures 732 and 742 may be similar to or different from that of the embedded planar resistor 710. The hollow structures 732 and 742 adjacent to the embedded planar resistor 710 are formed into a complementary hollow structure, so as to reduce the parasitic capacitance, efficiently enhance the application frequency range, and reduce the dielectric loss between the embedded planar resistor and the metal ground plane.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A complementary mirror image embedded planar resistor architecture, comprising:
   an embedded planar resistor, located on a first plane;
   a first electrode and a second electrode, located on the first plane, wherein the embedded planar resistor completely covers the first electrode, the first electrode is used to connect the embedded planar resistor to a first via hole, so as to further connect the embedded planar resistor to circuit elements on other planes above or below the embedded planar resistor, and the second electrode is used to connect the embedded planar resistor to a second conductive wire, so as to further connect the embedded planar resistor to circuit elements on other planes above or below the embedded planar resistor;
   a conductive layer, located on a second plane; and
   a dielectric layer, made of at least one material, and sandwiched between the first plane and the second plane,
   wherein a hollow structure is formed in the conductive layer at the mirror image location corresponding to the embedded planar resistor, and the shape and area of the hollow structure are designed corresponding to the shape and area of the embedded planar resistor;
   wherein the hollow structure is an entirely hollow structure, with an area of about 0.5-1.5 times of that of the embedded planar resistor.

2. The complementary mirror image embedded planar resistor architecture as claimed in claim 1, wherein the second conductive wire is a micro-strip line structure.

3. The complementary mirror image embedded planar resistor architecture as claimed in claim 1, wherein the second conductive wire is a floating line structure.

4. The complementary mirror image embedded planar resistor architecture as claimed in claim 1, wherein the second conductive wire is a second via hole.

5. The complementary mirror image embedded planar resistor architecture as claimed in claim 1, wherein the second electrode is partially covered by the embedded planar resistor, and the second conductive wire is a strip line structure.

6. The complementary mirror image embedded planar resistor architecture as claimed in claim 1, wherein the hollow structure is a mesh structure having a plurality of holes.

7. The complementary mirror image embedded planar resistor architecture as claimed in claim 1, wherein the hollow structure has plurality of strip-shaped holes.

8. The complementary mirror image embedded planar resistor architecture as claimed in claim 1, wherein the conductive layer is a ground plane or a power supply layer.

9. The complementary mirror image embedded planar resistor architecture as claimed in claim 1, wherein the conductive layer is an electrode plate of an embedded capacitor structure.

10. The complementary mirror image embedded planar resistor architecture as claimed in claim 1, further comprising another conductive layer on a third plane, wherein the conductive layer and said another conductive layer are ground planes, another hollow structure is formed in said another conductive layer at the mirror image location corresponding to the embedded planar resistor, and the shape and area of said another hollow structure are designed corresponding to the shape and area of the embedded planar resistor, and the first plane is disposed between the second plane and the third plane.

11. The complementary mirror image embedded planar resistor architecture as claimed in claim 1, further comprising a transmission line, disposed on a third plane below the conductive layer, wherein the transmission line overlaps at least a portion of a region on the third plane at a mirror image location corresponding to the embedded planar resistor,
  wherein a hollow structure is formed in the conductive layer at the mirror image location corresponding to the embedded planar resistor, and the shape and area of the hollow structure are designed according to that of the embedded planar resistor, the first electrode, and the second electrode.

12. A complementary mirror image embedded planar resistor architecture, comprising:
  an embedded planar resistor, located on a first plane;
  a first electrode and a second electrode, located on the first plane, wherein the embedded planar resistor completely covers the first electrode, the first electrode is used to connect the embedded planar resistor to a first via hole, so as to further connect the embedded planar resistor to circuit elements on other planes above or below the embedded planar resistor, and the second electrode is used to connect the embedded planar resistor to a second conductive wire, so as to further connect the embedded planar resistor to circuit elements on other planes above or below the embedded planar resistor;
  a conductive layer, located on a second plane; and
  a first dielectric layer and a second dielectric layer made of different materials, respectively, located beside each other, separated at a point under the embedded planar resistor, and sandwiched between the first plane and the second plane,
  wherein a hollow structure is formed in the conductive layer at the mirror image location corresponding to the embedded planar resistor, and the shape and area of the hollow structure are designed corresponding to the shape and area of the embedded planar resistor;
  wherein the hollow structure is an entirely hollow structure, with an area of about 0.5-1.5 times of that of the embedded planar resistor.

* * * * *